(12) United States Patent
Ryu et al.

(10) Patent No.: US 8,421,664 B2
(45) Date of Patent: Apr. 16, 2013

(54) ANALOG-TO-DIGITAL CONVERTER

(75) Inventors: Seung-Tak Ryu, Daejeon (KR); Jong-In Kim, Daejeon (KR); Ki-Jin Kim, Gyeonggi-do (KR); Kwang Ho Ahn, Gyeonggi-do (KR)

(73) Assignees: Korea Electronics Technology Instutitute, Seongnam-si, Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 176 days.

(21) Appl. No.: 12/981,664

(22) Filed: Dec. 30, 2010

(65) Prior Publication Data

US 2012/0105264 A1    May 3, 2012

(30) Foreign Application Priority Data

Nov. 2, 2010    (KR) .......................... 10-2010-0108365

(51) Int. Cl.
*H03M 1/12*    (2006.01)
(52) U.S. Cl.
USPC .......................................... 341/156; 341/155
(58) Field of Classification Search .................. 327/158, 327/536; 341/155, 156
See application file for complete search history.

(56) References Cited

U.S. PATENT DOCUMENTS

| 5,734,342 | A | 3/1998 | Mes |
| 6,377,200 | B1* | 4/2002 | Lee ................................ 341/155 |
| 7,279,959 | B1* | 10/2007 | Choy ............................ 327/536 |
| 2007/0188366 | A1* | 8/2007 | Makigawa et al. ........... 341/155 |
| 2010/0052749 | A1* | 3/2010 | Rim ............................... 327/158 |

FOREIGN PATENT DOCUMENTS

| JP | 7-79161 | 3/1995 |
| JP | 2005-12250 | 1/2005 |
| JP | 2009-296271 | 12/2009 |
| KR | 1997-7005872 | 10/1997 |

* cited by examiner

*Primary Examiner* — Jean B Jeanglaude
(74) *Attorney, Agent, or Firm* — Lowe Hauptman Ham & Berner, LLP (57) ABSTRACT

An analog-to-digital converter includes: a first latch row corresponding to a first stage; a second latch row corresponding to a second stage; and a digital processor for encoding output signals of the second latch row and generating a digital signal. The first latch row includes a plurality of first latches that receive an analog input signal and reference voltages and operate in synchronization with a first clock signal, and the second latch row includes: a plurality of second latches that receive outputs signals of the plurality of first latches and operate in synchronization with a second clock signal delayed from the first reference clock; and a plurality of third latches that receive output signals of two neighboring latches of the plurality of first latches and operate in synchronization with the second clock signal by means of an interpolation technique.

9 Claims, 11 Drawing Sheets

FIG. 11

US 8,421,664 B2

ANALOG-TO-DIGITAL CONVERTER

CROSS-REFERENCE TO RELATED APPLICATION

This application claims priority to and the benefit of Korean Patent Application No. 10-2010-0108365 filed in the Korean Intellectual Property Office on Nov. 2, 2010, the entire contents of which are incorporated herein by reference.

BACKGROUND OF THE INVENTION (a) Field of the Invention

The present invention relates to an analog-to-digital converter digital.

(b) Description of the Related Art

An analog-to-digital converter (hereinafter, referred to as an "ADC") that converts an analog signal into a digital signal is widely used in various electronic devices such as display devices, computers, home appliances, and communication systems. The ADC is becoming more important for image signal processing applications as multimedia services become popular.

As one example of an ADC, a flash ADC having a structure suitable for high-speed processing converts an analog input signal into a digital signal by comparing the level of an analog input voltage corresponding to the analog input signal with the level of a reference voltage divided by resistors, latching the outputs of the respective comparators, and encoding them. Such an ADC requires $2^n$ resistors, $2^n-1$ comparators, and $2^n-1$ latches for an n-bit digital output. Since the number of comparators needed for an n-bit resolution increases in proportion to $2^n$ exponential functions, increase in area and power consumption of an ADC requiring high resolution is disadvantageously caused by a large number of comparators.

Another example of an ADC includes an ADC using an interpolation technique to reduce the number of comparators exponentially increasing with increase in the number of digital output bits.

Figure 1:
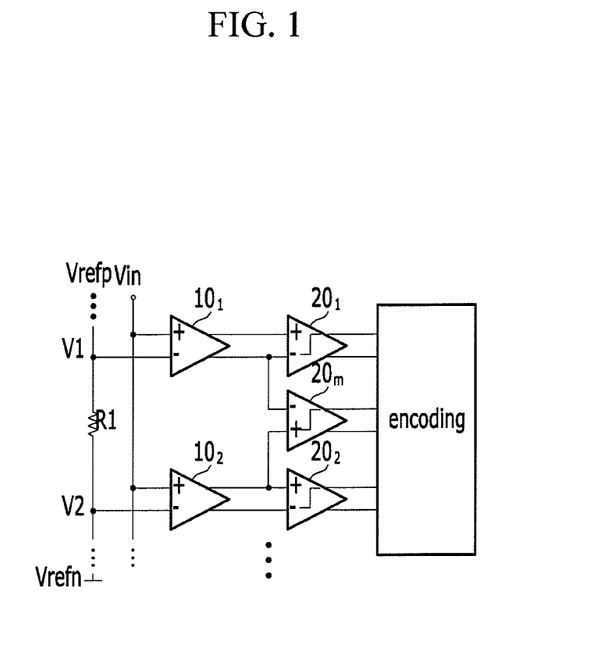
FIG. 1 is a view showing a conventional interpolating flash ADC.

FIG. 1 is a view showing a conventional interpolating flash ADC.

Referring to FIG. 1, the interpolating flash ADC comprises an intermediate latch $20_m$ which are interposed between two latches $20_1$ and $20_2$ receiving differential output signals of two comparators $10_1$ and $10_2$ amplifying differences between an analog input voltage and reference voltages V1 and V2, and receive the differential output signals of the two comparators $10_1$ and $10_2$. That is, the differential output signals of the two comparators $10_1$ and $10_2$ are used as an input to the intermediate latch $20_m$. As such, by using the differential output signals of the two comparators $10_1$ and $10_2$ as an input to the intermediate latch $30_m$, a new intermediate reference voltage $\{V_m=(V1+V2/2)\}$ between the reference voltages V1 and V2 is generated. That is, the intermediate latch $30_m$ is able to latch a signal zero-crossing at the intermediate reference voltage Vm even without a comparator for amplifying and outputting a difference between the intermediate reference voltage Vm and the analog input voltage.

As a result, using this interpolation technique, the same resolution as the aforementioned flash ADC can be realized while reducing the number of comparators. However, comparators have static current allowed to flow by a bias current source. Accordingly, a reduction in the number of comparators is still accompanied by high power consumption.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an analog-to-digital converter which can reduce power consumption.

According to an exemplary embodiment of the present invention, there is provided an analog-to-digital converter for converting an analog input signal into a digital signal. The analog-to-digital converter includes: a plurality of first latches; a plurality of second latches; at least one third latch; and a digital processor. The plurality of first latches latch an analog signal corresponding to the analog input signal and each reference voltage, and amplify differences between the two latched voltages and output first differential output signal pairs. The plurality of second latches latch the first differential output signal pairs of the plurality of first latches, and amplify voltage differences between the latched first differential output signal pairs and output second differential output signal pairs. The at least one third latch latches the first differential output signal pairs of two neighboring latches of the plurality of first latches, and amplifies voltage differences between the latched first differential output signal pairs of the two latches and output third differential output signal pairs. The digital processor encodes the second and third differential output signal pairs.

The analog-to-digital converter according to another exemplary embodiment of the present invention includes: a first latch row; a second latch row; and a digital processor. The first latch row includes a first latch and a second latch that receive an analog input signal and each reference voltage and operate in synchronization a first reference clock. The second latch row includes: a third latch and a fourth latch that directly receive output signals of the first and second latches and operate in response to a second reference clock delayed from the first reference clock; and at least one fifth latch that operates in synchronization with the second reference clock by means of an interpolation technique using the output signals of the first and second latches. The digital processor encodes the output signals of the second latch row to generate a digital signal.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification and claims, unless explicitly described to the contrary, the word "comprise" and variations such as "comprises" or "comprising", will be understood to imply the inclusion of stated elements but not the exclusion of any other elements.

Now, an analog-to-digital converter according to an exemplary embodiment of the present invention will be described in detail with reference to the drawings.

Figure 2:
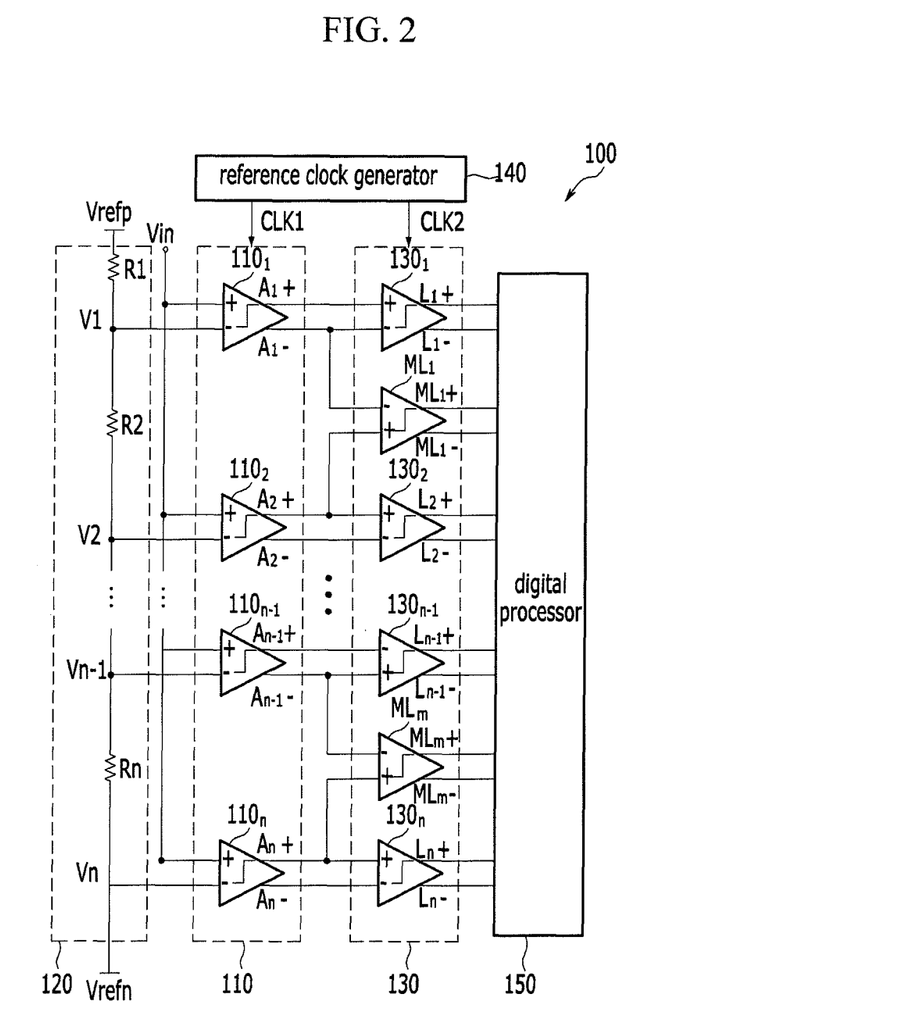
FIGS. 2 and 3 are views respectively showing analog-to-digital converters according to first and second exemplary embodiments of the present invention.
Figure 3:
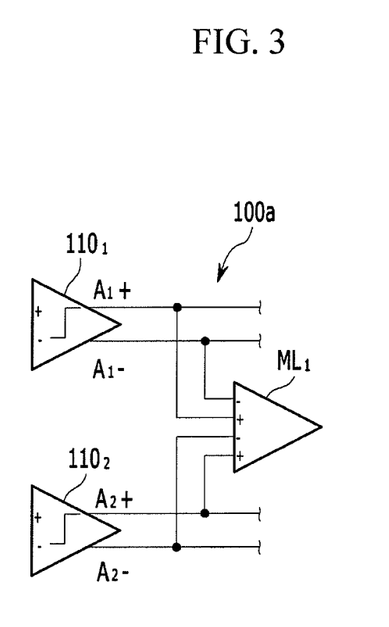
Figure 4:
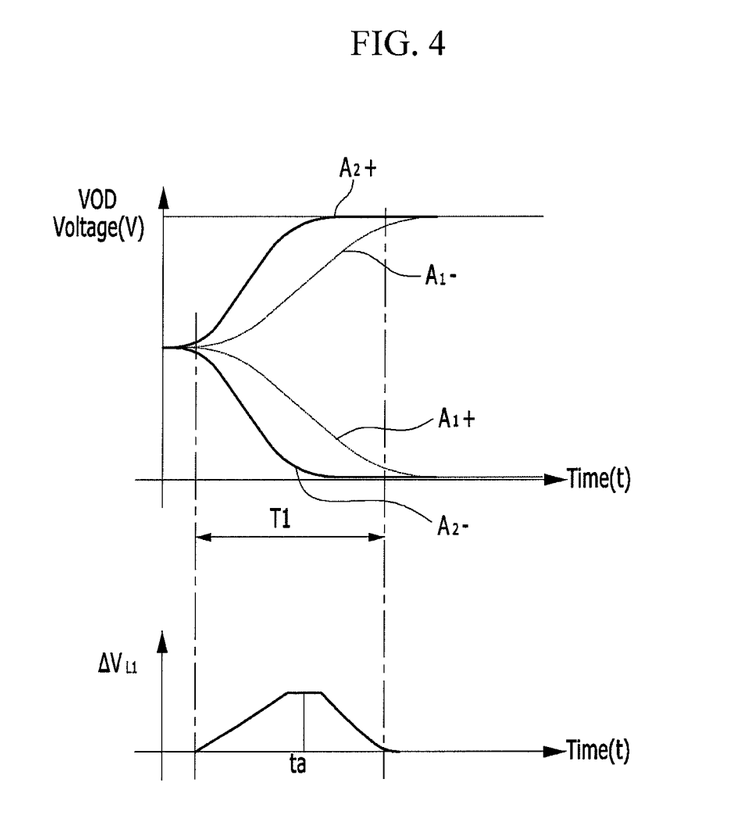
FIGS. 4 and 5 are views respectively showing output characteristics of a latch.
Figure 5:
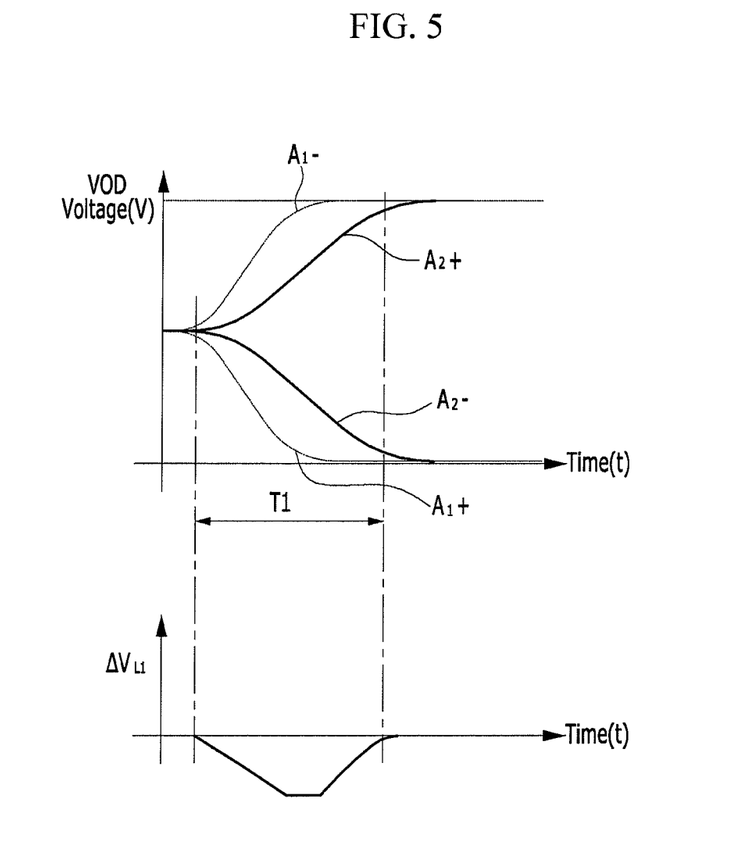

FIGS. 2 and 3 are views respectively showing analog-to-digital converters according to first and second exemplary embodiments of the present invention. FIGS. 4 and 5 are views respectively showing output characteristics of a latch. FIG. 3 illustrates only one latch using an interpolation technique for the convenience of explanation.

Referring to FIG. 2, the analog-to-digital converter 100 comprises a first latch row 110, a reference voltage generator 120, a second latch row 130, a reference clock generator 140, and a digital processor 150.

The first latch row 110 comprises a plurality of latches $110_1$ to $110_n$. These latches $110_1$ to $110_n$ amplify differences between an analog input voltage Vin and reference voltages V1 to Vn and convert it to a digital level.

The analog input voltage Vin is input into input terminals (+) of the latches $110_1$-$110_n$, and the reference voltages V1 to Vn, which are compared with the analog input voltage Vin, are input into input terminals (−) of the latches $110_1$ to $110_n$. These latches $110_1$ to $110_n$ latch the analog input voltage Vin and the reference voltages V1 to Vn in synchronization with a reference clock CLK1, and amplify the differences between the latched analog input voltage Vin and the latched reference voltages V1 to Vn to output signals of a differential form (hereinafter, referred to as first differential output signal pairs) $A_1+$, $A_1-$, . . . , $A_n+$, $A_n-$.

The reference voltage generator 120 generates the reference voltages V1 to Vn, and input the reference voltages V1 to Vn into the input terminals (−1) of the latches $110_1$ to $110_n$. The reference voltage generator 120 may comprise a plurality of resistors R1 to Rn connected in series between power sources which supply two voltages Vrefp and Vrefn, respectively. Each of the reference voltages V1 to Vn input into the input terminals (−) of the latches $110_1$ to $110_n$ corresponds to a voltage obtained by dividing a difference between the two voltages Vrefp and Vrefn by the plurality of resistors R1 to Rn. Both of the two voltages Vrefp and Vrefn may be positive voltages, or one Vrefp of the two voltages vrefp and Vrefn may be a positive voltage and the other one Vrefn may be a negative voltage. Also, one of the two voltages Vrefp and Vrefn may be a ground voltage.

The second latch row 130 comprises a plurality of latches $130_1$ to $130_n$ and $ML_1$ to $ML_m$.

The first differential output signal pairs $A_1+$, $A_1-$, . . . , $A_n+$, $A_n-$ of the latches $110_1$-$110_n$ of the first latch row 110 are respectively input as they are to input terminals (+, −) of the latches $130_1$ to $130_n$. Of two neighboring latches of the first latch 110, one signal $A_1-$, . . . $A_{n-1}-$ of the first differential output signal pair of an odd-numbered latch $110_1$, . . . , $110_{n-1}$ is input into an input terminal (−) of the latch $ML_1$ to $ML_m$, and one signal $A_{2+}$, . . . $A_{n+}$ of the first differential output signal pair of an even-numbered latch $110_2$, . . . , $110_n$ is input into an input terminal (+) of the latch $ML_1$ to $ML_m$.

The plurality of latches $130_1$ to $130_n$ and $ML_1$ to $ML_m$ latch voltages input into the input terminals (+, −) in synchronization with a reference clock CLK2, and amplify a difference between the two latched voltages to output signals of a differential form (hereinafter, referred to as a "second differential output signal pair") $L_1+$, $L_1-$, . . . , $L_n+$, $L_n-$, $ML_1+$, $ML_1-$, . . . , $ML_m+$, $ML_m-$.

Alternatively, as shown in FIG. 3, the latch $ML_1$ of the analog-to-digital converter 100a may receive both of the first differential output signal pairs $A_1+$, $A_1-$, $A_2+$, and $A_2-$ of two neighboring latches, e.g., latches $110_1$ and $110_2$, of the first latch row 110.

Although FIG. 3 has illustrated only one latch $ML_1$, the same may apply to the other latches $ML_2$-$ML_m$.

Referring again to FIG. 2, the latches $110_1$ to $110_n$, $130_1$ to $130_n$, $ML_1$ to $ML_m$ have the characteristic that the time required for the output to be converted to a digital level varies depending on a voltage difference between signals input into two input terminals (+, −).

For example, if the difference between the analog input voltage Vin and the reference voltage V1 is less than the difference between the analog input voltage Vin and the reference voltage V2, the differential output signal pairs $A_1+$, $A_1-$, $A_2+$, and $A_2-$ of the latches $110_1$ and $110_2$ have the form as shown in FIG. 4. That is, because the difference between the analog input voltage Vin and the reference voltage V1 is less than the difference between the analog input voltage Vin and the reference voltage V2, the time required for the differential output signal pair $A_1+$ and $A_1-$ to be converted to a digital level is longer than the time required for the differential output signal pair $A_2+$ and $A_2-$ to be converted to a digital level.

Also, if the difference between the analog input voltage Vin and the reference voltage V1 is greater than the difference between the analog input voltage Vin and the reference voltage V2, the differential output signal pairs $A_1+$, $A_1-$, $A_2+$, and $A_2-$ of the latches $110_1$ and $110_2$ have the form as shown in FIG. 5.

In general, latches cannot use an interpolation technique in a voltage range. Nevertheless, interpolation may be possible during a specific time interval T1 by using the characteristic that the time required for the latches to produce a digital level output is proportional to a voltage difference between signals input into input terminals (+, −).

Therefore, according to an exemplary embodiment of the present invention, the latches $ML_1$ to $ML_m$ can receive first different output signal pairs $A_1+$, $A_1-$, . . . , $A_n+$, $A_n-$ of two neighboring latches $110_1$ to $110_n$ of the first latch row 110 and additionally output second differential output signal pairs $M_1+$, $M_1-$, . . . , $M_m+$, $M_m-$ by means of an interpolation technique.

For example, the latch $ML_1$ receiving the differential output signals $A_1-$ and $A_2+$ of the form shown in FIG. 4 as an input may additionally generate a differential output signal pair $ML_1+$ and $ML_1-$ by amplifying the differential output signals $A_1-$ and $A_2+$ at time Ta of the specific time interval T1 and amplifying them. At this point, if the latching is performed at a time point when the voltage difference $\Delta V_{L1}$ between the differential output signals $A_1-$ and $A_2+$ is the greatest, the differential output signal pair $ML_1+$ and $ML_1-$ having a digital level can be generated within a short time.

Referring again to FIG. 2, the reference clock generator 140 supplies reference clocks CLK1 and CLK2, respectively, to the first latch row 110 and the second latch row 130. At this point, in order to enable interpolation at the latches $ML_1$ to $ML_m$, the first differential output signal pairs $A_1+$, $A_1-$, . . . , $A_n+$, $A_n-$ of the latches $110_1$ to $110_n$ have to be latched within a time interval (T1 of FIG. 4). Thus, the reference clock generator 140 delays the reference clock CLK1 to be supplied to the first latch row 110, and generates the reference clock CLK2 to be supplied to the second latch row 130 and supplies it to the second latch row 130.

The digital processor 150 outputs a final digital signal by encoding the differential output signal pairs $L_1+, L_1-, \ldots, L_n+, L_n-$ and $M_1+, M_1-, \ldots, M_m+, M_m-$ of the latches $130_1$ to $130_n$ and $L_1$ to $L_m$ of the second latch row 130.

For example, to output a final digital signal of 4 bits, a conventional flash ADC requires 15 ($=2^4-1$) comparators. Also, the interpolating flash ADC of FIG. 1 requires 10 comparators. However, the 10 comparators have static current allowed to flow by a bias current source, thus resulting in the problem of high power consumption. However, the ADC 100 according to the first exemplary embodiment of the present invention uses the latches $110_1$ to $110_n$ with no static power consumption instead of comparators with static power consumption, and also can employ an interpolation technique, thereby reducing power consumption compared to the interpolating flash ADC of FIG. 1.

On the other hand, unlike the first exemplary embodiment of the present invention, neighboring latches (e.g., $110_1$ and $110_2$) may use differential output signal pairs (e.g., $A_1+, A_1-, A_2+$, and $A_2-$) to generate two or more second differential output signal pairs. This exemplary embodiment will be described in greater details with reference to FIGS. 6 to 9.

Figure 6:
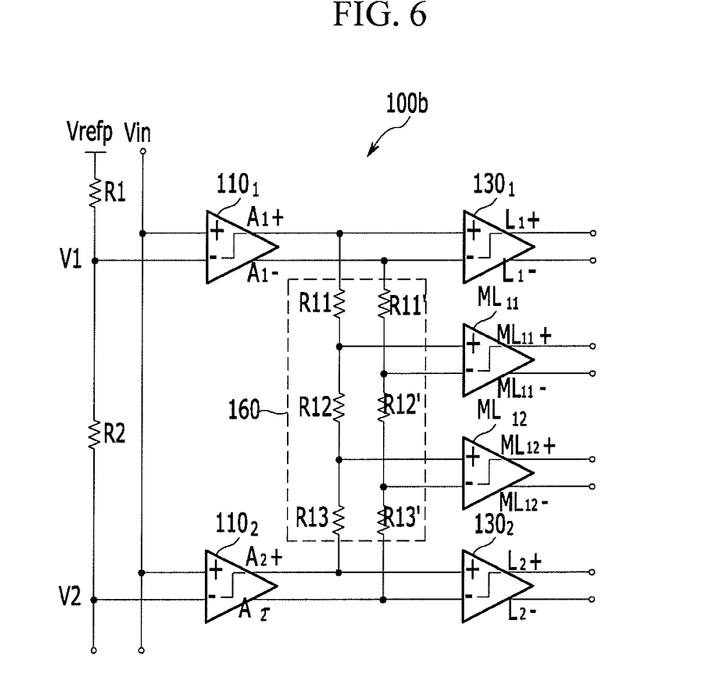
FIGS. 6 and 7 are view respectively showing an analog-to-digital converter according to third and fourth exemplary embodiments of the present invention.
Figure 7:
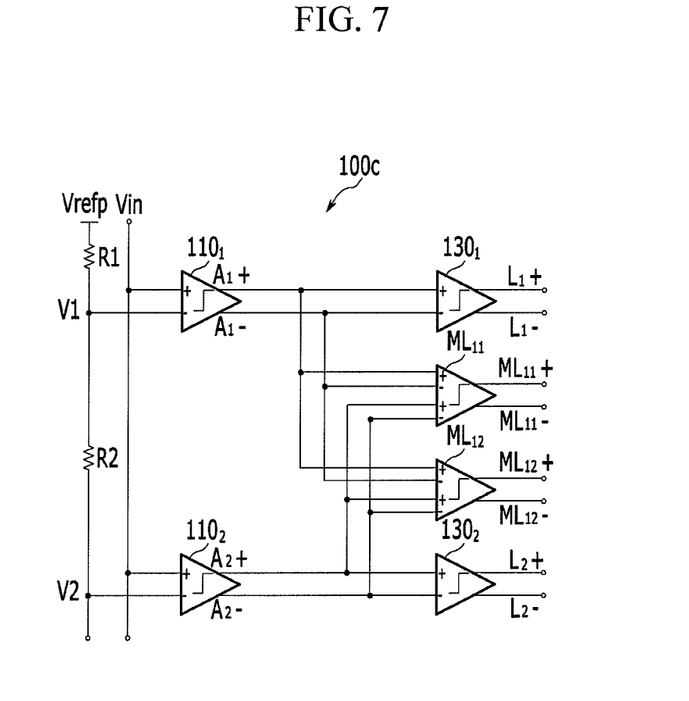

FIGS. 6 and 7 are view respectively showing an analog-to-digital converter according to third and fourth exemplary embodiments of the present invention. FIGS. 6 and 7 illustrate only two latches $110_1$ and $110_2$ of the first latch row 110 for the convenience of explanation.

Referring to FIG. 6, the analog-to-digital converter 100a according to the second exemplary embodiment may further comprise a resistor row 160.

The resistor row 160 comprises a plurality of resistors R11 to R13 and R11' to R13'. The plurality of resistors R11 to R13 are connected in series between the first differential output signals $A_1+$ and $A_2+$ of the two latches $110_1$ and $110_2$, and the plurality of resistors R11' to R13' are connected in series between the first differential output signals $A_1-$ and $A_2-$ of the two latches $110_1$ and $110_2$.

Then, voltages between the first different output signals $A_1+$ and $A_2+/A_1-$ and $A_2-$ of the two latches $110_1$ and $110_2$ are divided by the plurality of resistors R11 to R13/R11' to R13' and the voltages divided by the plurality of resistors R11 to R13/R11' to R13' are input into the latches $ML_{11}$ and $ML_{12}$. Then, second differential output signal pairs $ML_{11}+, ML_{11}-, ML_{12}+$, and $ML_{12}-$ may be additionally generated by the latches $ML_{11}$ and $ML_{12}$. That is, differential output signal pairs, whose number is one less than the number of resistors connected in series, may be additionally generated.

FIG. 6 illustrates that the second differential output signal pairs $ML_{11}+$ and $ML_{11}-/ML_{12}+$ and $ML_{12}-$ may be additionally generated by the three resistors R11 to R13/R11' to R13' connected in series.

Such an ADC 100b according to the second exemplary embodiment has a reduced number of latches of the first latch row 110 used to achieve the same resolution as the first exemplary embodiment, compared to the first exemplary embodiment. By the way, the resistor row 160 causes an increase in power consumption.

Therefore, as shown in FIG. 7, an ADC 100c according to a third exemplary embodiment of the present invention can additionally generate second differential output signal pairs $ML_{11}+, ML_{11}-, ML_{12}+$, and $ML_{12}-$ by using the first differential output signal pairs $A_1+, A_1-, A_2+$, and $A_2-$ of the two neighboring latches $110_1$ and $110_2$ without using the resistor row 160.

Specifically, the latches $ML_{11}$ and $ML_{12}$ using an interpolation technique receive the first differential output signal pair $A_1+$ and $A_1-$ of the latch $110_1$ by the input terminals (+, −) and the first differential output signal $A_2+$ and $A_2-$ of the latch $110_2$ by the input terminals (+, −), and generate second differential output signal pairs $ML_{11}+, ML_{11}-, ML_{12}+$, and $ML_{12}-$. This is enabled by adjusting the size of transistors comprising the input terminals (+, −) of the latches $130_1, L_{11}, L_{12}$, and $130_2$ of the second latch row 130.

Figure 8:
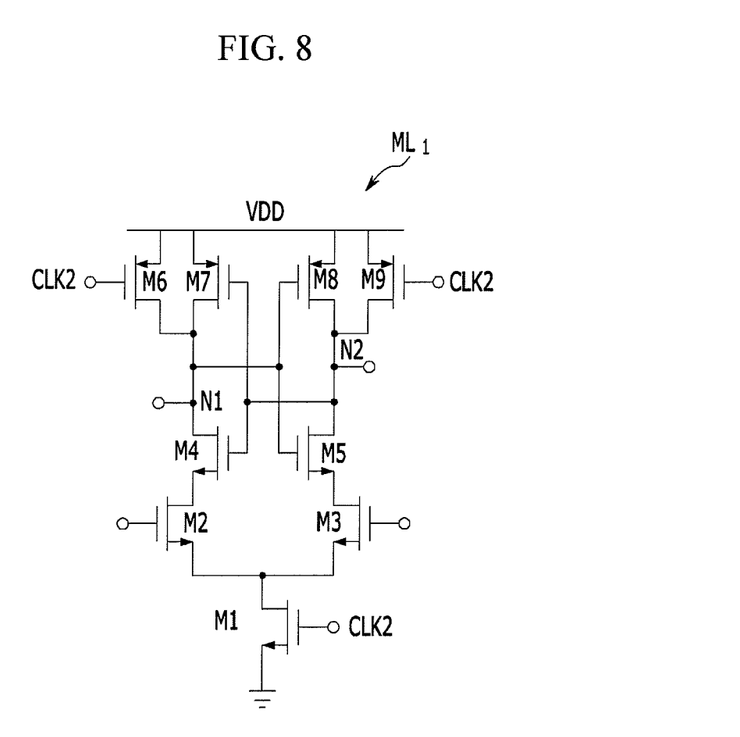
FIGS. 8 and 9 are circuit diagrams each showing an example of a latch.
Figure 9:
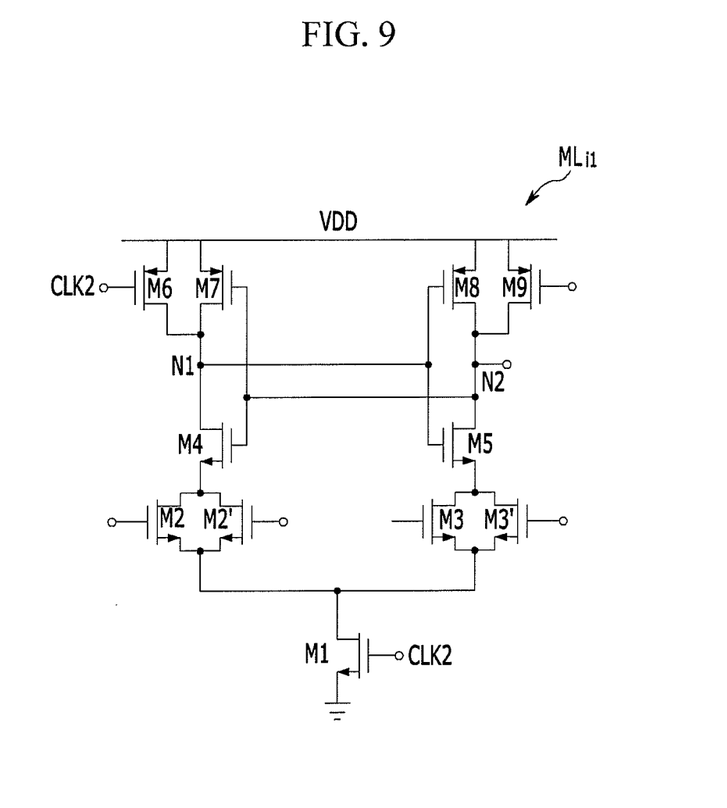

FIGS. 8 and 9 are circuit diagrams each showing a example of a latch. Although FIGS. 8 and 9 have illustrated only one latch $ML_1$, the other latches of the first and second latches 110 and 130 may be configured in the same manner as the latch $ML_1$.

Referring to FIG. 8, the latch $ML_1$ comprises transistors M1 to M9.

In this case, the transistors M1 to M9 are switches each having a control terminal, an input terminal, and an output terminal. FIG. 8 illustrates the transistors M1 to M9 as n-channel electric field effect transistors FETs. In this case, the control terminal, the input terminal, and the output terminal correspond to a gate, a drain, and a source, respectively.

Moreover, FIG. 8 illustrates the transistors M6 to M9 as p-channel FET transistors. In this, the control terminal, the input terminal, and the output terminal correspond to a gate, a drain, and a source, respectively.

Body diodes may be formed in a direction from a source to a drain at the transistors M1 to M9. Rather than using FETs, other transistors having similar functions can be used as the transistors M1 to M9. For example, insulated gate bipolar transistors (IGBTs) may be used as the transistors M1 to M9.

Specifically, the gates of the transistors M2 and M3 respectively form the input terminals (+, −) of the latch $ML_1$.

The sources of the transistors M2 and M3 are connected to the drain of the transistor M1, and the source of the transistor M1 is connected to a ground terminal. A reference clock CLK2 is input into the gate of the transistor M1.

The drains of the transistors M2 and M3 are respectively connected to the sources of the transistors M4 and M5, and the drains of the transistors M4 and M5 are connected to nodes N1 and N2 forming the two output terminals of the latch $ML_1$.

The drains of the two transistors M6 and M7 are connected to the node N1, and the drains of the two transistors M8 and M9 are connected to the node N2. The sources of the two transistors M6 and M7 and the sources of the two transistors M8 and M9 are connected to a power source VDD, the reference clock CLK2 is input into the gates of the transistors M6 and M9, and the gates of the transistors M7 and M8 are respectively connected to the transistors M4 and M5.

The gates of the transistors M4 and M7 are connected to the node N2, and the gates of the transistors M5 and M8 are connected to the node N1.

The operation of the latch $ML_1$ will be described on the assumption that a low level voltage is input into the gate of the transistors M2 and a high level voltage is input into the gate of the transistor M3.

When the reference clock CLK2 is at high level, the transistors M1 and M3 are turned on and the transistors M2, M6, and M9 are turned off. Then, the drain voltage of the transistor M5 becomes lower, and hence the gate voltage of the transistor M5 becomes higher than the drain voltage of the transistor M5. Accordingly, the transistor M5 is turned on, and the voltage of the node becomes 0V.

Moreover, as the voltage of the node N2 becomes 0V, the transistor M4 is turned off and the transistor M7 is turned on. Consequently, the voltage of the node N1 becomes VDD.

On the other hand, when the reference clock CLK2 is at low level, the transistors M6 and M8 are turned on and the transistor M1 is turned off. Hence, the voltage of the nodes N1 and N2 becomes VDD.

In contrast, if a high level voltage is input into the gate of the transistor M2 and a low level voltage is input into the gate of the transistor M3, when the reference clock CLK2 is at high level, the voltage of the node N1 becomes 0V and the voltage of the node N2 becomes VDD, while, when the reference clock CLK2 is at low level, the voltage of the nodes N1 and N2 becomes VDD.

It should be noted that such a structure is merely an example, and a latch having a different structure may be used as the latch $ML_1$.

Meanwhile, as shown in FIG. 7, the latch $ML_{11}$ receiving both of the differential output signal pairs $A_1+$, $A_1-$, $A_2+$, and $A_2-$ of the two latches $110_1$ and $110_2$ may be implemented, as shown in FIG. 9, by a transistor pair M2 and M2' receiving the first differential output signal pair $A_1+$ and $A_1-$ of the latch $110_2$ and a transistor pair M3 and M3' receiving the first differential output signal pair $A_2+$ and $A_2-$ of the latch $110_2$.

At this point, the size of each of the transistors M1 to M9 and M2' to M3', i.e., the width and length W/L of the gate thereof, can be adjusted. Thus, by adjusting the size of the transistors connected to the input terminals (+, −) of the latches $130_1$, $L_{11}$, $L_{12}$, and $130_2$ of the second latch row 130 in FIG. 7, the same effect as the use of the resistor row 160 can be exhibited without using the resistor row 160.

For example, to additionally generate two second differential output signal pairs $ML_{11}+$, $ML_{11}-$, $ML_{12}+$, and $ML_{12}-$, when the size of the two transistors M2 and M3 connected to the input terminals (+, −) of the latches $130_1$ and $130_2$ is assumed to be 1, if the sizes of the two transistors M2 and M2' of the latch $ML_{11}$ and $ML_{12}$, which form the input terminals (+, −) receiving the first differential output signal pair $A_1+$ and $A_1-$ of the latch $110_1$, are set to ⅔ and ⅓, respectively, and the sizes of the two transistors M2 and M2' of the latches $ML_{11}$ and $ML_{12}$, which form the input terminals (+, −) receiving the first differential output signal pair $A_2+$ and $A_2-$ of the latch $130_2$, are set to ⅓ and ⅔, respectively, the latches $ML_{11}$ and $ML_{12}$ may additionally generate two second differential output signal pairs $ML_{11}+$, $ML_{11}-$, $ML_{12}+$, and $ML_{12}-$.

Figure 10:
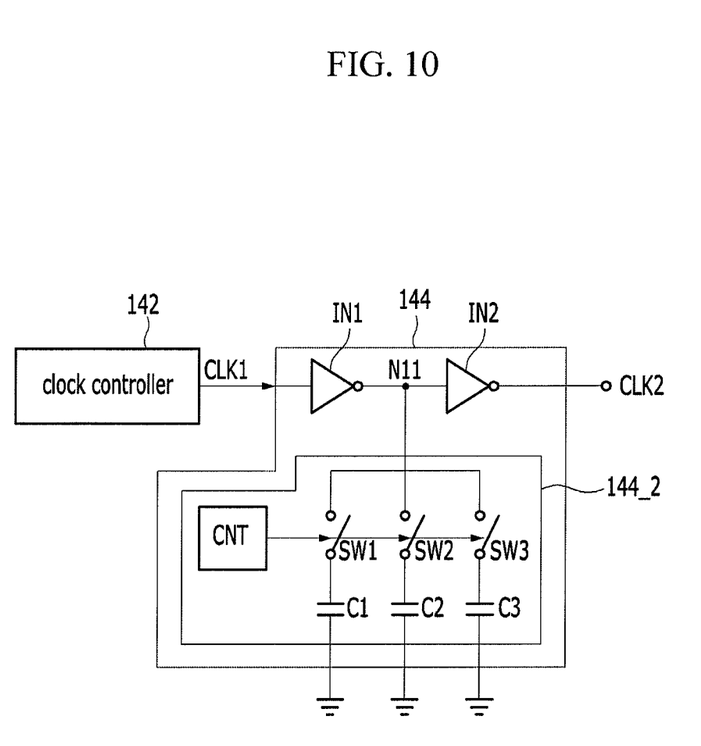
FIG. 10 is a view schematically showing the reference clock generator shown in FIG. 2.
Figure 11:
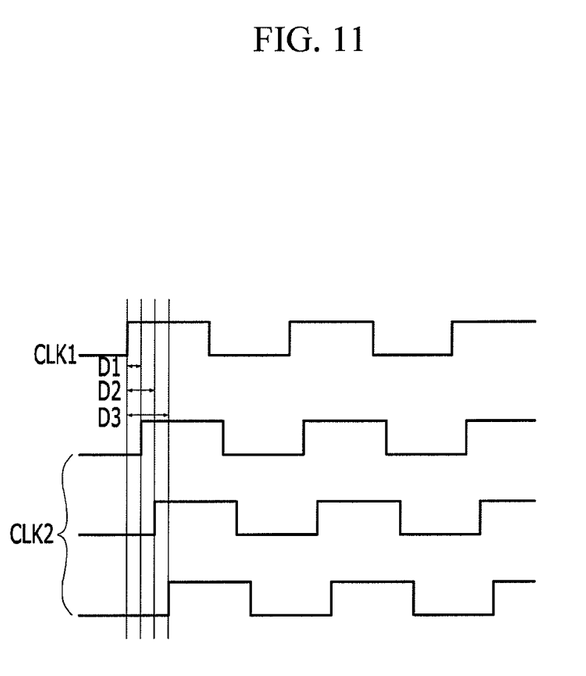
FIG. 11 is a view showing a reference clock generated by the reference clock generator of FIG. 10.

FIG. 10 is a view schematically showing the reference clock generator shown in FIG. 2, and FIG. 11 is a view showing a reference clock generated by the reference clock generator of FIG. 10.

Referring to FIG. 10, the reference clock generator 140 comprises clock controllers 142 and 144.

The clock controller 142 generates a reference clock CLK1, and supplies the reference clock CLK1 to the first latch row 110.

The clock controller 144 generates a reference clock CLK2 using the reference clock CLK1, and supplies the reference clock CLK2 to the second latch row 130.

In one example for generating the reference clock CLK2 using the reference clock CLK1, the clock controller 144 may comprise inverters IN1 and IN2 and a delay controller 144_2. The inverter IN1 inverts the reference clock CLK1 and outputs it, and the inverter IN2 inverts the inverted reference clock CLk1 again and outputs it.

The delay controller 144_2 delays the reference clock inverted by the inverter IN1 and outputs it to the inverter IN2. At this point, the delay controller 144_2 may use the time constant of a capacitor as a delay time.

The delay controller 144_2 according to an exemplary embodiment of the present invention comprises a plurality of capacitors C1 to C3, a plurality of switches SW1 to SW3, and a controller CNT to ensure proper operational timing of the second latch row 130. The plurality of capacitor C1 to C3 have different time constants from. The time constants of the capacitors C1 to C3 may be different or the same. The plurality of capacitors C1 to C3 are connected between the node N11 between the output terminal of the inverter IN1 and the input terminal of the inverter IN2 and the ground terminal. The plurality of switches SW1 to SW3 are connected to the capacitors 1 to C3 corresponding to the node N11. The controller CNT turns on at least one of the plurality of switches SW1 to SW3. At this point, the controller CNT may turn on one switch according to a user's command.

Because the plurality of capacitors C1 to C3 have their respective time constants, the reference clock CLK2 can be generated by delaying the reference clock CLK1 by a time equal to the time constant of at least one capacitor by a switch turned on by the operational characteristics of the second latch row 130 depending on changes in temperature and outside environment.

For example, reference clocks CLK2 equal to delay times D1, D2, and D3 may be generated, as shown in FIG. 11, by the time constants of the plurality of capacitors C1 to C3, and one of them may be used as a reference clock CLK2 to be supplied to the second latch row 130.

In this way, when one proper reference clock CLK2 is set in accordance with the operational characteristics of the second latch row 130, the second latch row 130 can perform latching more accurately.

According to an exemplary embodiment of the present invention, static current consumed by a bias current source of a comparator can be eliminated by using a latch instead of the comparator. As a result, power consumption can be reduced.

Moreover, the size of the analog-to-digital converter can be reduced because the latch requires no bias current source.

The exemplary embodiments of the present invention are not implemented only by a device and/or method, but can be implemented through a program for realizing functions corresponding to the configuration of the exemplary embodiments of the present invention and a recording medium having the program recorded thereon. These implementations can be realized by the ordinarily skilled person in the art from the description of the above-described exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An analog-to-digital converter for converting an analog input signal into a digital signal, comprising:
    a plurality of first latches configured to latch an analog signal corresponding to the analog input signal and each reference voltage, and amplify differences between the two latched voltages and output first differential output signal pairs;
    a plurality of second latches configured to latch the first differential output signal pairs of the plurality of first latches, and amplify voltage differences between the latched first differential output signal pairs and output second differential output signal pairs;

at least one third latch configured to latch the first differential output signal pairs of two neighboring latches of the plurality of first latches before the first differential output signal pairs of the two neighboring latches become 0 or 1, and amplify voltage differences between the latched first differential output signal pairs of the two latches and output third differential output signal pairs; and a digital processor configured to encode the second and third differential output signal pairs.

2. The analog-to-digital converter of claim 1, further comprising a reference clock generator configured to generate a first clock signal and generate a second reference clock for delaying the first reference clock, and the plurality of first latches configured to perform a latch operation in synchronization with the first reference clock, and the plurality of second and third latches configured to perform a latch operation in synchronization with the second reference clock.

3. The analog-to-digital converter of claim 2, wherein the reference clock generator comprises:

a first inverter configured to output a first clock signal inverted from the first reference clock;

a delay controller configured to output a second clock signal delayed from the first clock signal; and a second inverter configured to output a third clock signal inverted from the second clock signal, wherein the third clock signal is the second reference clock.

4. The analog-to-digital converter of claim 3, wherein the delay controller comprises:

a plurality of capacitors having different time constants;

a plurality of switches connected between the plurality of capacitors and an input terminal of the second inverter; and a controller configured to turn on at least one of the plurality of switches.

5. The analog-to-digital converter of claim 1, wherein the digital processor is configured to perform encoding into a digital signal of n bits, the sum of the number of the plurality of second latches and the number of the plurality of third latches is $2n-1$, and the number of the plurality of first latches is less than $2n-1$, wherein n is a positive number.

6. The analog-to-digital converter of claim 1, wherein the plurality of second latches and the at least one third latch have transistors of different sizes that respectively form the input terminals.

7. An analog-to-digital converter for converting an analog input signal into a digital signal, comprising:

a first latch row comprising a first latch and a second latch configured to receive an analog input signal and each reference voltage and operate in synchronization with a first reference clock;

a second latch row comprising a third latch and a fourth latch configured to directly receive output signals of the first and second latches and operate in response to a second reference clock delayed from the first reference clock, and at least one fifth latch configured to operate in synchronization with the second reference clock and interpolate using the output signals of the first and second latches before the output signals of the first and second latches become 1 or 0; and a digital processor configured to encode the output signals of the second latch row to generate a digital signal.

8. The analog-to-digital converter of claim 7, wherein the third latch and the fourth latch have transistors of the same size forming the input terminals, and the size of the transistor forming the input terminal of the at least one fifth latch is different from the size of the transistors forming the input terminals of the third and fourth latches.

9. The analog-to-digital converter of claim 1, wherein the third latch configured to receive both of the first differential output signal pairs of two neighboring latches.

* * * * *